US009632863B2

(12) United States Patent
Galbraith et al.

(10) Patent No.: US 9,632,863 B2
(45) Date of Patent: Apr. 25, 2017

(54) TRACK ERROR-CORRECTING CODE EXTENSION

(71) Applicant: HGST Netherlands B.V., Amsterdam (NL)

(72) Inventors: Richard L. Galbraith, Rochester, MN (US); Weldon M. Hanson, Rochester, MN (US); Roger W. Wood, Gilroy, CA (US)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 14/595,801

(22) Filed: Jan. 13, 2015

(65) Prior Publication Data

US 2016/0203041 A1    Jul. 14, 2016

(51) Int. Cl.
*G11C 29/00* (2006.01)
*G06F 11/10* (2006.01)
*H03M 13/00* (2006.01)
*H03M 13/11* (2006.01)

(52) U.S. Cl.
CPC ......... *G06F 11/10* (2013.01); *H03M 13/6325* (2013.01); *H03M 13/1111* (2013.01)

(58) Field of Classification Search
CPC ................................ G06F 11/10; H03M 13/11
See application file for complete search history.

(56) References Cited

U.S. PATENT DOCUMENTS

| | | | |
|---|---|---|---|
| 4,908,826 A | 3/1990 | Hertrich | |
| 5,926,612 A | 7/1999 | Gillard et al. | |
| 6,043,946 A | 3/2000 | Genheimer et al. | |
| 6,367,047 B1 | 4/2002 | McAuliffe et al. | |
| 8,296,637 B1* | 10/2012 | Varnica | H03M 13/1102 714/794 |
| 8,413,009 B2 | 4/2013 | Yeung et al. | |
| 2014/0101515 A1 | 4/2014 | Akiyama et al. | |
| 2015/0200688 A1* | 7/2015 | Pan | H03M 13/3927 714/794 |

OTHER PUBLICATIONS

Gunnam et al., "A Low Power Architecture for Min-Sum Decoding of LDPC Codes," Department of Electrical and Computer Engineering, Technical Report,Texas A&M University, May 2006, 9 pp.
Gunnam et al., "A Low Power Architecture for Min-Sum Decoding of LDPC Codes," Department of Electrical and Computer Engineering, Technical Report, Texas A&M University, May 2006, 9 pp.

* cited by examiner

*Primary Examiner* — Sam Rizk
(74) *Attorney, Agent, or Firm* — Foley & Lardner LLP

(57) ABSTRACT

In general, techniques are described for performing track-error-correcting code on data. A hard drive comprising a storage device and a read channel may be configured to perform the techniques. The read channel may be configured to read data from a track comprising a plurality of data sectors each comprising a plurality of bits, and a parity sector comprising a plurality of parity bits, wherein the data includes a plurality of bit groups, each bit group including a single bit from each data sector, and wherein each parity bit corresponds to a respective bit group, perform a track parity check, and, responsive to determining that the data includes an error, identify one or more data sectors as possible sources of the at least one error and adjust a log-likelihood ratio for at least one bit from the bit group.

61 Claims, 5 Drawing Sheets

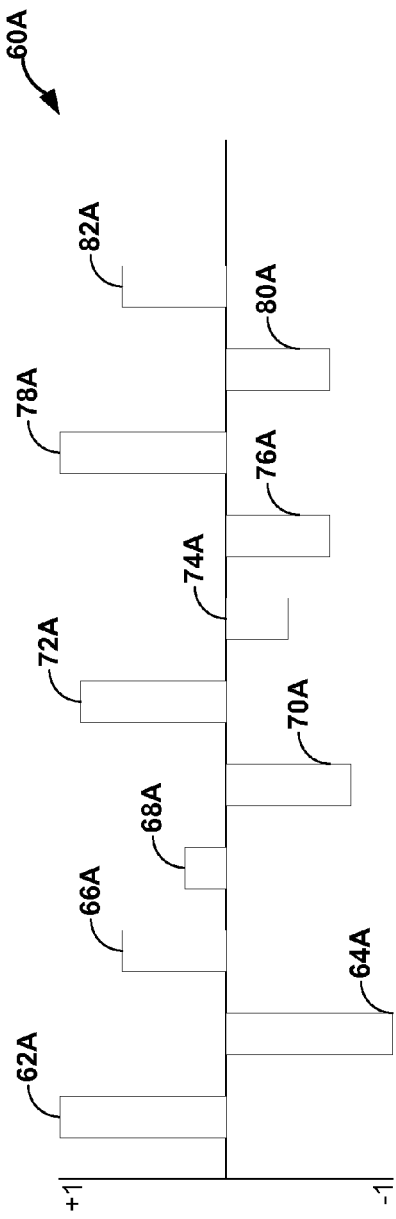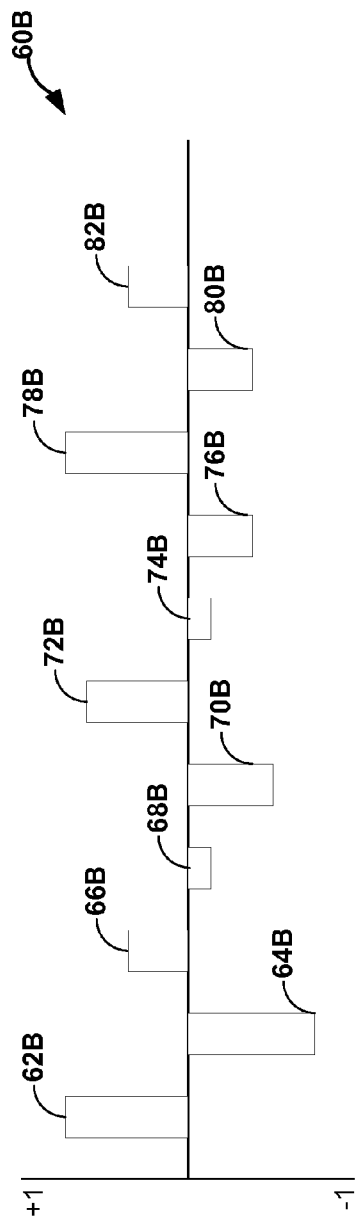

TRACK ERROR-CORRECTING CODE EXTENSION

TECHNICAL FIELD

This disclosure relates to error correction for hard drives.

BACKGROUND

An error-correcting code (ECC) is a system of adding redundant data, or parity data, to a message, such that it can be recovered by a receiver even when a number of errors (up to the capability of the code being used) are introduced. With respect to storage devices, ECC may be applied within a single sector or within an entire track of the storage device. Track-ECC in erasure mode cannot correct more failed sectors than the number of parity sectors. In many examples, each data sector may have 4,096 bytes, or about 40,000 encoded bits of information. Therefore, the hard drive needs to store an extra 40,000 bits for each data sector that may be restored by track-ECC, reducing the amount of space available to store data.

SUMMARY

In one example, the disclosure is directed to a method comprising reading, by a read channel of a hard drive, data from a track, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein a parity bit is a bit that indicates a binary characteristic of the big group with which it is associated, determining, by the read channel and based at least in part on a bit group from the plurality of bit groups and a corresponding parity bit from the plurality of parity bits, whether the data from the track includes at least one error by performing a track parity check, and, responsive to determining that the data includes at least one error, identifying, by the read channel, one or more data sectors from the plurality of data sectors as one or more possible sources of the at least one error and adjusting, by the read channel, a log-likelihood ratio for at least one bit from the bit group.

In another example, the disclosure is directed to a device comprising a storage device configured to store a track of data, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein a parity bit is a bit that indicates a binary characteristic of the big group with which it is associated, and a read channel configured to read the data from the track, determine, based at least in part on a bit group from the plurality of bit groups and a corresponding parity bit from the plurality of parity bits by performing a track parity check, whether the data from the track includes at least one error, and, responsive to determining that the data includes at least one error, identify one or more data sectors from the plurality of data sectors as one or more possible sources of the at least one error and adjust a log-likelihood ratio for at least one bit from the bit group.

In another example, the disclosure is directed to a device means for reading data from a track, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein a parity bit is a bit that indicates a binary characteristic of the big group with which it is associated, means for determining, based at least in part on a bit group from the plurality of bit groups and a corresponding parity bit from the plurality of parity bits, whether the data from the track includes at least one error by performing a track parity check, and, responsive to determining that the data includes at least one error, means for identifying one or more data sectors from the plurality of data sectors as one or more possible sources of the at least one error and means for adjusting a log-likelihood ratio for at least one bit from the bit group.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 4A and 4B are conceptual diagrams illustrating an example technique of adjusting log-likelihood ratios for data sectors that may contain an error, in accordance with one or more techniques of this disclosure.

DETAILED DESCRIPTION

Figure 1:
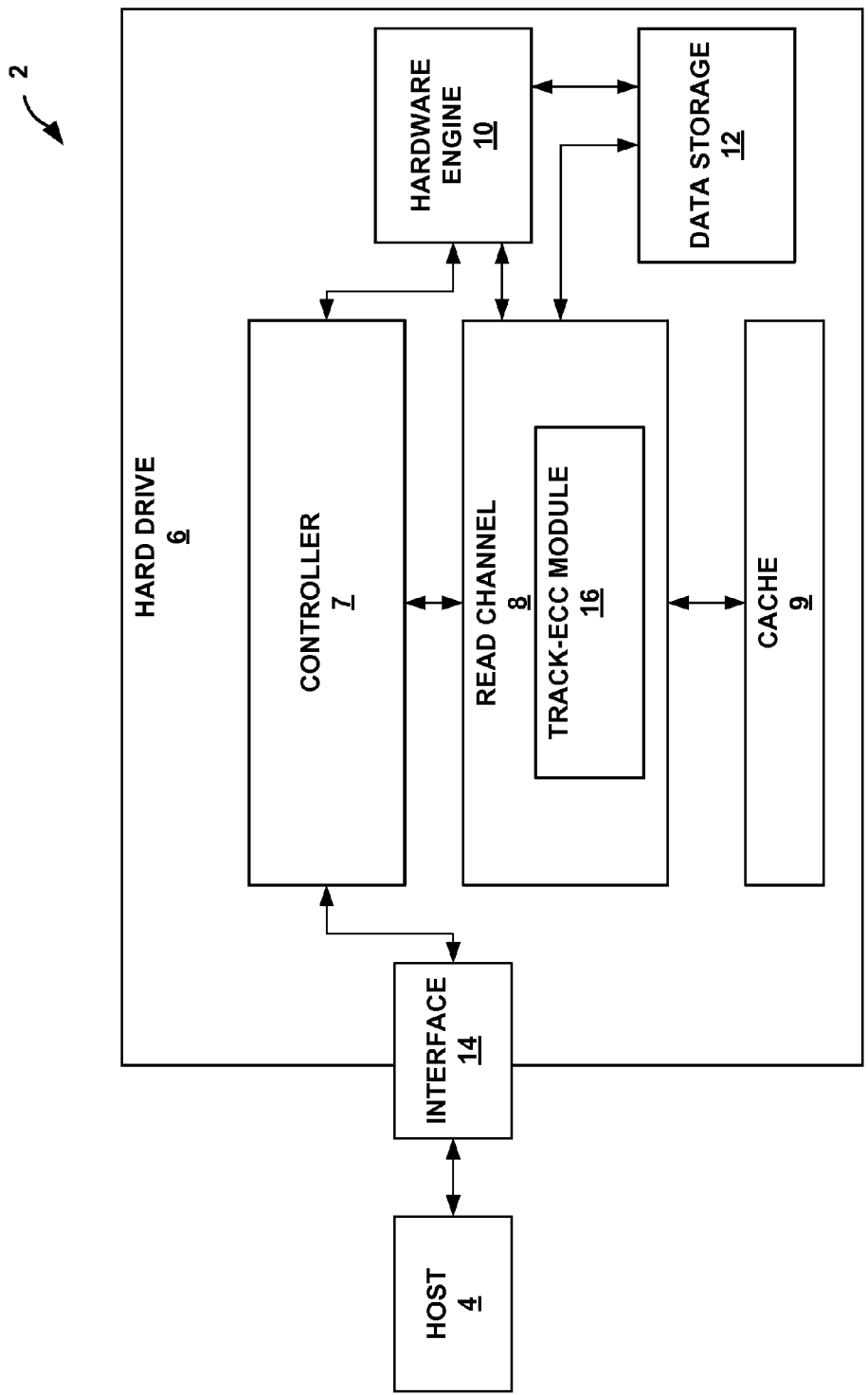
FIG. 1 is a conceptual and schematic block diagram illustrating an example storage environment in which a hard drive may function as a storage device for a host device, in accordance with one or more techniques of this disclosure.

Techniques are described for aiding the recovery of several bad data sectors by using information gained from one or a small number of parity check sectors that cover a large total number of data sectors. Current technology using hard erasure-correction cannot correct more bad sectors than there are parity sectors. Techniques described herein include soft decoding techniques that allow many more bad data sectors to be corrected than there are parity sectors. The hard drive read channel may be configured to read data from a track comprising a plurality of data sectors each comprising a plurality of bits and one or more parity sectors each comprising a plurality of parity bits. The track includes a plurality of bit groups, each bit group typically including one or more bits from each data sector. Further, each bit group includes one or more parity bits from the parity sectors. These parity bits in the parity sectors are chosen to force a known parity on each such group of bits. During read-back, it can be recognized that it may not be possible to recover the data in one or more data sectors. In this case, some of the bits in each such group of bits remain unknown. However, from the known data in the recovered sectors and from the known parity that each group must satisfy, the parity of the unknown bits in each group can be ascertained. This parity information can be introduced to aid the detection and decoding process. A joint detection process involving passing likelihood information between the several bad sectors can result is a large improvement in recoverability of sectors. This improvement is to the extent that a small number of parity sectors (for example, 1) can correct a large number (for example, 10) of moderately-damaged and otherwise-unrecoverable data sectors.

In general, techniques of this disclosure describe a track parity check that may be used as part of track-error-correction code (track-ECC) to aid in the error correction of tracks of data. Specifically, if some sectors are known to have failed to converge to a valid answer, a storage device read channel may run a track parity check and, from the results of the track parity check, provide additional extrinsic information to assist the convergence of the failed sectors and allow them to be recovered with high probability. These techniques may be based on the system's ability to recognize, with high probability, sectors that have not initially been correctly recovered. This recognition may be accomplished by the inclusion of explicit strong redundancy checks into the sector. These techniques may be performed in place of or in addition to low density parity checks (LDPC) that may be performed within a single data sector using LDPC bits in each respective data sector formed during the initial writing of data to each respective data sector.

One sector of the track, referred to herein as a "parity sector," typically includes parity bits used to perform the track parity check, with each bit in the parity sector corresponding to a respective bit group. A parity bit is a bit that indicates a binary characteristic of the big group with which it is associated. These track parity bits are formed during the creation of the track of data by performing an XOR operation across each bit in a bit group, the result of which is the parity bit for that particular bit group. This is repeated for each bit group in the track, creating the aforementioned parity sector. When the data is subsequently being read by a read channel of a hard drive, these XOR operations may be repeated for each of the bit groups to determine if the result of said operations is still the same as the parity bit in the previously written parity sector. If the track parity check results in a finding of no errors (i.e., each result bit is the same as the respective track parity bit), then the read channel may reinforce the likelihood that those bits have the correct value. If the track parity check results in finding that some errors do exist (i.e., the result bit for at least one bit group is different than the respective track parity bit), then the read channel may reduce the likelihood that those bits have the correct value. The read channel will incorporate this extrinsic likelihood information into the sector detection and decoding operations and ultimately act to alter one or more bits in the bit group that belong to the failed data sectors such that all the data sectors on the track can be correctly recovered. The operation of the read channel detection and decoding processes may be iterative in that the likelihood information may be passed back and forth many times as the information is refined. In particular, in the context of track-ECC, the likelihood information may be passed back and forth between operations contained within a sector and operations contained within a track-ECC parity check.

In this manner, a read channel may be able to resolve errors where multiple sectors fail to converge while only having a single parity sector. That is, rather than ECC methods that may only restore as many failed sectors as there are parity sectors, techniques of this disclosure may enable a read channel of a storage device to correct multiple failed sectors using only a single parity sector. In this way, the techniques of this disclosure may reduce the space required for the storage of the parity bits and increase the space available for storing data while maintaining the ability to self-correct a plurality of failed data sectors.

FIG. 1 is a conceptual and schematic block diagram illustrating an example storage environment 2 in which hard drive 6 may function as a storage device for host device 4, in accordance with one or more techniques of this disclosure. For instance, host device 4 may utilize non-volatile memory devices included in hard drive 6 to store and retrieve data. In some examples, storage environment 2 may include a plurality of storage devices, such as hard drive 6, that may operate as a storage array. For instance, storage environment 2 may include a plurality of hard drives 6 configured as a redundant array of inexpensive/independent disks (RAID) that collectively function as a mass storage device for host device 4. While techniques of this disclosure generally refer to storage environment 2 and hard drive 6, techniques described herein may be performed in any storage environment that utilizes tracks of data.

Storage environment 2 may include host device 4 which may store and/or retrieve data to and/or from one or more storage devices, such as hard drive 6. As illustrated in FIG. 1, host device 4 may communicate with hard drive 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like. Typically, host device 4 comprises any device having a processing unit, which may refer to any form of hardware capable of processing data and may include a general purpose processing unit (such as a central processing unit (CPU), dedicated hardware (such as an application specific integrated circuit (ASIC)), configurable hardware such as a field programmable gate array (FPGA) or any other form of processing unit configured by way of software instructions, microcode, firmware or the like. For the purpose of executing techniques of this disclosure, host device 4 may send tracks of data to read channel 8 via interface 14 for the purpose of correcting any possible errors in the tracks using track-ECC techniques described herein.

As illustrated in FIG. 1 hard drive 6 may include controller 7, read channel 8, hardware engine 10, cache 9, and interface 14. In some examples, hard drive 6 may include additional components not shown in FIG. 1 for ease of illustration purposes. For example, hard drive 6 may include power delivery components, including, for example, a capacitor, super capacitor, or battery; a printed board (PB) to which components of hard drive 6 are mechanically attached and which includes electrically conductive traces that electrically interconnect components of hard drive 6, and the like. In some examples, the physical dimensions and connector configurations of hard drive 6 may conform to one or more standard form factors. Some example standard form factors include, but are not limited to, 3.5" hard disk drive (HDD), 2.5" HDD, or 1.8" HDD.

Hard drive 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), and PCI-express (PCIe). The electrical connection of interface 14 (e.g., the data bus, the control bus, or both) is electrically connected to controller 7, providing electrical connection between host device 4 and controller 7, allowing data to be exchanged between host device 4 and controller 7. In some examples, the electrical connection of interface 14 may also permit hard drive 6 to receive power from host device 4.

In the example of FIG. 1, hard drive 6 includes hardware engine 10, which may represent the hardware responsible for interfacing with the storage medium. Hardware engine 10 may, in the context of a platter-based hard drive, represent the magnetic read/write head and the accompanying hardware to configure, drive and process the signals sensed by the magnetic read/write head. Although described in the following examples as being performed in the context of a hard drive, the techniques described in this disclosure may be extended to any type of hardware engine as described in more detail below with respect to the example of FIG. 2.

Hard drive 6 includes controller 7, which may manage one or more operations of hard drive 6. Controller 7 may interface with host device 4 via interface 14 and manage the storage of data to and the retrieval of data from data storage 12 accessible via hardware engine 10. In some examples, controller 7 may be a hardware controller. In other examples, controller 7 may be implemented into hard drive 6 as a software controller.

Hard drive 6 also includes read channel 8, which may further manage one or more operations of hard drive 6. Read channel 8 may be an electrical circuit that transforms a physical magnetic flux into abstract bits. In other words, read channel 8 may be operable by controller 7 to physically read the data in data storage 12 and convert the physical magnetic flux into abstract bits usable by a device that contains hard drive 6. In other words, read channel 8 may, as one example, manage reads from the memory devices, e.g., Negated AND (NAND) flash memory chips or hard disk drive platters. Read channel 8 may further include one or more features that may perform techniques of this disclosure, such as track-ECC module 16.

Host 4 may, in this respect, interface with various hardware engines, such as hardware engine 10, to interact with various sensors. Host 4 may execute software, such as the above noted operating system, to manage interactions between host 4 and hardware engine 10. The operating system may perform arbitration in the context of multi-core CPUs, where each core effectively represents a different CPU, to determine which of the CPUs may access hardware engine 10. The operating system may also perform queue management within the context of a single CPU to address how various events, such as read and write requests in the example of hard drive 6, issued by host 4 should be processed by hardware engine 10 of hard drive 6.

In the example of FIG. 1, one or more data storage devices 12 may be operable to store information for processing during operation of hard drive 6. For instance, hard drive 6 may store data that controller 7 may access during execution at hard drive 6. In some examples, data storage devices 12 represent temporary memories, meaning that a primary purpose of data storage devices 12 may not be long-term storage. For instance, data storage devices 12 of hard drive 6 may be volatile memory, meaning that data storage devices 12 may not retain stored contents if powered off. Examples of volatile memories include random access memories (RAM), dynamic random access memories (DRAM), static random access memories (SRAM), and other forms of volatile memories known in the art.

Data storage devices 12, in some examples, also include one or more computer-readable storage media. Data storage devices 12 may be configured to store larger amounts of information than volatile memory. Data storage devices 12 may further be configured for long-term storage of information. In some examples, data storage devices 12 may include non-volatile storage elements, meaning that data storage devices 12 may maintain information through power on/power off cycles. Examples of non-volatile memories include magnetic hard discs, optical discs, floppy discs, flash memories, hard disk drive pallets, or forms of electrically programmable memories (EPROM) or electrically erasable and programmable (EEPROM) memories. Data storage devices 12 may, in some examples, store program instructions and/or information (e.g., data) associated with controller 7 such as during program execution.

Techniques of this disclosure may enable read channel 8 to perform track-ECC on tracks of data to correct any sectors that may contain errors. Read channel 8 may read data from a track. In some examples, host 4 may insert a data disk containing a track of data which read channel 8 may read via interface 14. For instance, host 4 may be a laptop or a desktop computer, and a user may insert a disk into host 4, such as a compact disk, a floppy disk, or a Universal Serial Bus (USB) drive. In another example, read channel 8 may read a track of data from data storage devices 12 stored in hard drive 6. In other words, read channel 8 may perform the track-ECC techniques disclosure herein on tracks of data stored within hard drive 6 or on outside data received from host 4 via interface 14.

The track includes a plurality of data sectors and a parity sector. Each data sector in the plurality of data sectors is made up of a plurality of bits, and the parity sector is made up of a plurality of parity bits. In some examples, the parity sector is created dynamically when the data is written to the tracks and the plurality of data sectors. A parity bit may be a bit that indicates a binary characteristic of the big group with which it is associated. In reading the data, read channel 8 analyzes a log-likelihood ratio (LLR) for each bit. The LLR is a number that may be a positive number or a negative number. If the LLR is a positive number, then the LLR indicates that the value of the bit is more likely to be a 1 than a 0. If the LLR is a negative number, then the LLR indicates that the value of the bit is more likely to be a 0 than a 1. Further, the magnitude of the LLR indicates a certainty that the bit has a value of 0 or 1. For instance, if the LLR has a larger magnitude, then the LLR is more likely to be correct in indicating that the positive number is a 1 or the negative number is a 0. Conversely, if the LLR has a smaller magnitude, then the LLR is less likely to be correct in indicating that the positive number is a 1 or the negative number is a 0.

Read channel 8 may determine whether the data from the track includes at least one error by performing a track parity check. Read channel 8 may group the data read from the track into a plurality of bit groups, with each bit group including a single bit from each of the plurality of data sectors. In some examples, the bits in the bit group may all be from the same position within the respective data sector. For instance, read channel 8 may form a bit group using a bit in the nth position from each of the plurality of data sectors through the use of an index, in some examples. In other examples, the bits in the bit group may be in different positions within the respective data sector. Furthermore, each parity bit from the plurality of parity bits may correspond to a respective bit group having a single bit from each of the plurality of data sectors. For each bit group and the corresponding parity bit, read channel 8 may run an error check on the respective bit group to determine if the data of the respective bit group includes at least one error. In some examples, the error check may be a track parity check, where read channel 8 performs an XOR operation on each bit in the bit group to obtain a result bit and compares the result bit to the parity bit that corresponds to the respective bit group. In some examples, the result of that comparison may also be called a syndrome bit.

Responsive to determining that the data includes at least one error, read channel 8 may identify one or more data sectors from the plurality of data sectors as one or more possible sources of the at least one error. In some examples, to identify one or more data sectors from the plurality of data sectors as one or more possible sources of the at least one error, read channel 8 may attempt to read each of the data sectors. Read channel 8 may flag a data sector as a possible source of the at least one error if the data sector fails to converge when being read by read channel 8. If a data sector fails to converge, for instance, read channel 8 may identify that data sector as a possible source of the at least one error. If read channel 8 identifies that the data sector is a possible source of the at least one error, then further actions may be taken.

In attempting to correct the error, read channel 8 may adjust a log-likelihood ratio (LLR) for at least one bit from the bit group. In some examples, the LLR may be adjusted according to a simplified Min-Sum algorithm, generating extrinsic information for further parity checks using the LLR. Read channel 8 may adjust the LLR for the at least one bit from the bit group using extrinsic information derived using techniques described in greater detail below with respect to FIGS. 2-4. For instance, by adjusting the LLR, one or more of the bits may be read differently (e.g., as a 0 instead of a 1 or a 1 instead of a 0). As described above, a positive LLR indicates a likeliness that the bit is a 1, and a negative LLR indicates a likeliness that the bit is a 0. Adjusting the LLR may cause one or more bits to have an LLR that changes from positive to negative or from negative to positive, thereby altering the likelihood of the value of the bit. By adjusting the LLR for at least one bit from the bit group used to determine if the data on the track includes an error, techniques of this disclosure may allow multiple data sectors to be corrected upon the determination of the presence of an error while only having the overhead of a single parity sector, thereby increasing correction efficiency and maximizing the available storage space on the said track.

Figure 2:
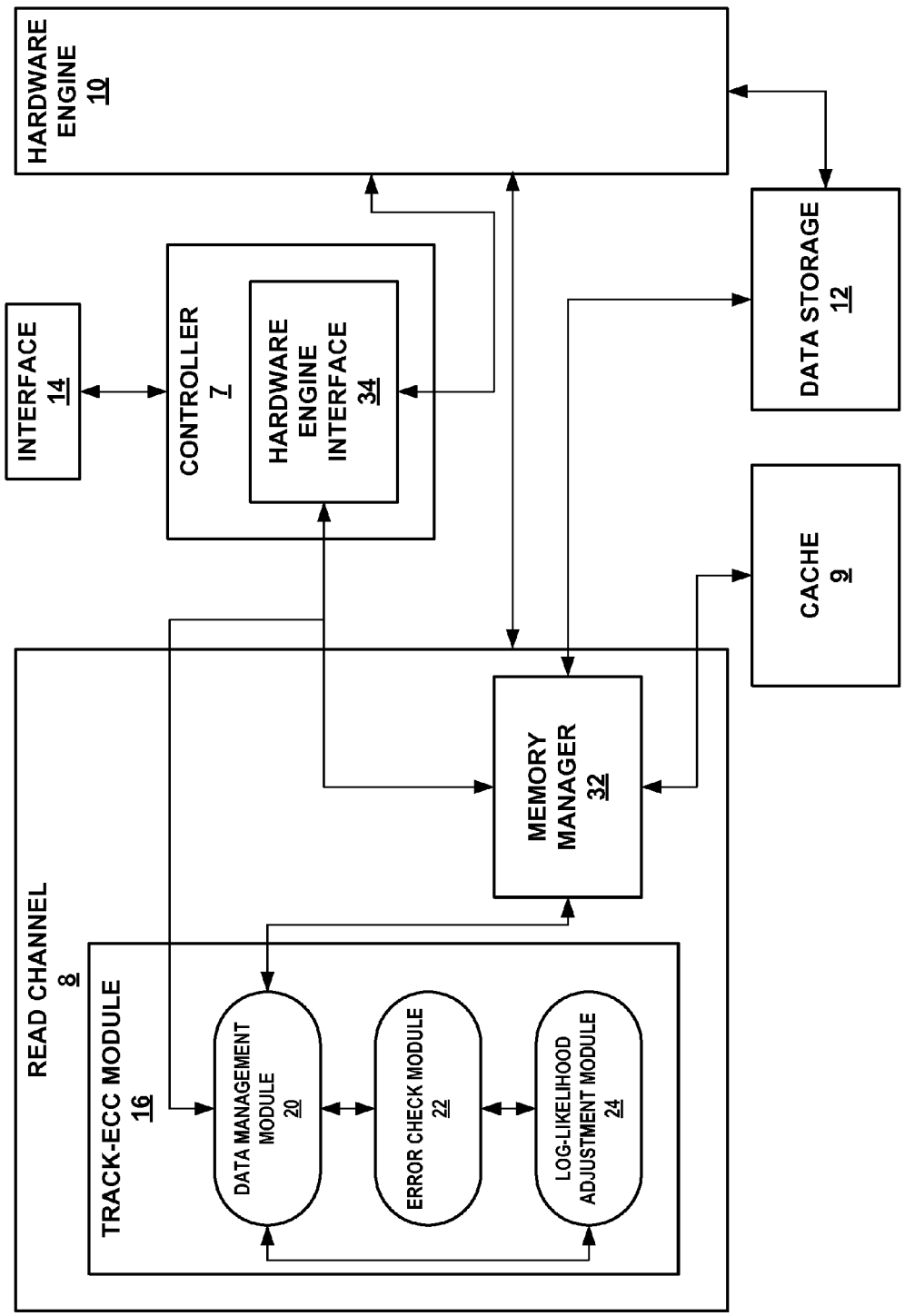
FIG. 2 is a block diagram illustrating the read channel and other components of the hard drive of FIG. 1 in more detail.

FIG. 2 is a block diagram illustrating read channel 8 and other components of hard drive 6 of FIG. 1 in more detail. In the example of FIG. 2, read channel 8 includes track-ECC module 16 and memory manager unit 32. Further, controller 7 includes hardware engine interface unit 34 and is in communication with interface 14.

Hardware engine interface unit 34 may perform various functions typical of a controller on a hard drive. For instance, hardware engine interface unit 34 may represent a unit configured to facilitate communications between the hardware controller 7 and the hardware engine 10. Hardware engine interface unit 34 may present a standardized or uniform way by which controller 7 may interface with hardware engine 10. Hardware engine interface 34 may provide various configuration data and events to hardware engine 10, which may then process the event in accordance with the configuration data, returning various different types of information depending on the event. In the context of an event requesting that data be read (e.g., a read request), hardware engine 10 may return the data to hardware engine interface 34, which may pass the data to memory manager unit 32 of read channel 8. Memory manager unit 32 of read channel 8 may store the read data to cache 9 and return a pointer or other indication of where this read data is stored to hardware engine interface 34 of controller 7. In the context of an event involving a request to write data (e.g. a write request), hardware engine 10 may return an indication that the write has completed to hardware engine interface unit 34. In this respect, hardware engine interface unit 34 may provide a protocol and handshake mechanism with which controller 7 may interface with hardware engine 10.

Track-ECC module 16 of read channel 8 includes various modules, including data management module 20, error check module 22, and log-likelihood adjustment module 24. The various modules of track-ECC module 16 may be configured to perform various techniques of this disclosure, including the technique described above with respect to FIG. 1. Data management module 20, error check module 22, and log-likelihood adjustment module 24 may perform operations described herein using software, hardware, firmware, or a mixture of both hardware, software, and firmware residing in and/or executing on hard drive 6.

Using data management module 20, error check module 22, and log-likelihood adjustment module 24, read channel 8 may perform techniques of this disclosure to perform track-ECC on tracks of data to correct any sectors that may contain errors. Data management module 20 may read data from a track. In some examples, a host may insert a data disk containing a track of data which data management module 20 may read via interface 14 and controller 7. For instance, the host may be a laptop or a desktop computer, and a user may insert a disk into the host, such as a compact disk, a floppy disk, or a Universal Serial Bus (USB) drive. In another example, data management module 20 may read a track of data from data storage devices 12 stored in hard drive 6 via memory manager 32.

Error check module 22 may determine whether the data from the track includes at least one error by performing a track parity check. Error check module 22 may group the data read from the track into a plurality of bit groups, with each bit group including a single bit from each of the plurality of data sectors. In some examples, the bits in the bit group may all be from the same position within the respective data sector. For instance, error check module 22 may form a bit group using a bit in the nth position from each of the plurality of data sectors through the use of an index, in some examples. In other examples, the bits in the bit group may be in different positions within the respective data sector. Furthermore, each parity bit from the plurality of parity bits may correspond to a respective bit group having a single bit from each of the plurality of data sectors. For each bit group and the corresponding parity bit, error check module 22 may run an error check on the respective bit group to determine if the data of the respective bit group includes at least one error. In some examples, the error check may be a track parity check, where error check module 22 performs an exclusive disjunction operation, such as an XOR operation, on each bit in the bit group to obtain a result bit and compares the result bit to the parity bit that corresponds to the respective bit group. Error check module 22 may determine that an error is present if the result bit is different than the parity bit.

In some examples, error check module 22 may determine whether the data from the track includes at least one error by performing a track parity check using the technique described above for each of a plurality of bit groups, such that each bit in the track is used in at least one error check. In such a case, each bit group that includes at least one error may be corrected in accordance with one or more techniques of this disclosure. For instance, if the track has a total of 40,000 bit groups, and 1,000 of those bit groups contains at least one error, then error check module 22 may identify one or more sectors from the plurality of data sectors as one or more possible sources of the at least one error for each of the 1,000 bit groups that contain at least one error. Further, log-likelihood adjustment module 24 may adjust a log-likelihood ratio for at least one bit from each bit group.

Responsive to determining that the data includes at least one error, error check module 22 may identify one or more data sectors from the plurality of data sectors as one or more possible sources of the at least one error. In some examples, to identify one or more data sectors from the plurality of data sectors as one or more possible sources of the at least one error, read channel 8 may attempt to read each of the data sectors. Read channel 8 may flag a data sector as a possible source of the at least one error if the data sector fails to converge when being read by read channel 8. In other words, if a data sector fails to converge, for instance, error check module 22 may identify that data sector as a possible source of the at least one error. If error check module 22 identifies that the data sector is a possible source of the at least one error, then further actions may be taken. If error check module 22 identifies that the data sector is not a possible source of the at least one error, data management module 20 will store the safe data sectors in cache 9 via memory manager 32.

In attempting to correct the error, log-likelihood adjustment module 24 may adjust a log-likelihood ratio (LLR) for at least one bit from the bit group. For instance, by adjusting the LLR, one or more of the bits may be read differently (e.g., as a 0 instead of a 1 or a 1 instead of a 0). As described above, a positive LLR indicates a likeliness that the bit is a 1, and a negative LLR indicates a likeliness that the bit is a 0. Adjusting the LLR may cause one or more bits to have an LLR that changes from positive to negative or from negative to positive, thereby altering the likelihood of the value of the bit. By adjusting the LLR for at least one bit from the bit group used to determine if the data on the track includes an error, techniques of this disclosure may allow multiple data sectors to be corrected upon the determination of the presence of an error while only having the overhead of a single parity sector, thereby increasing correction efficiency and maximizing the available storage space on the said track.

Log-likelihood adjustment module 24 may adjust the LLR by first determining the LLR for each bit in the bit group that corresponds to the one or more data sectors from the plurality of data sectors identified as the one or more possible sources of the at least one error. As described above, a bit group comprises a bit from each data sector of the plurality of sectors. Using techniques described above to identify one or more data sectors that may be the one or more possible sources of the at least one error, log-likelihood adjustment module 24 may determine an LLR for each bit in the bit group corresponding to those sectors. The LLR is a number that may be a positive number or a negative number. If the LLR is a positive number, then the LLR indicates that the value of the bit is more likely to be a 1 than a 0. If the LLR is a negative number, then the LLR indicates that the value of the bit is more likely to be a 0 than a 1. Further, the magnitude of the LLR indicates a certainty that the bit has a value of 0 or 1. For instance, if the LLR has a larger magnitude, then the LLR is more likely to be correct in indicating that the positive number is a 1 or the negative number is a 0. Conversely, if the LLR has a smaller magnitude, then the LLR is less likely to be correct in indicating that the positive number is a 1 or the negative number is a 0. In other examples, if the track parity check determines that there is no error in the bit group, read channel 8 may increase the magnitude of the LLR for each bit in the bit group, indicating that the bits in the bit group are likely correct. There may be no error in the bit group if the result bit is the same as the parity bit.

For the set of bits for which a LLR was determined, log-likelihood adjustment module 24 may determine a first magnitude of the LLR for a first error prone bit. The first error prone bit may be one of the bits for which a log-likelihood ratio is determined that has a log-likelihood ratio with the smallest magnitude. In other words, whether the first error prone bit has a positive LLR or a negative LLR, the first error prone bit is the bit for which the certainty of the value of the bit is the lowest. Log-likelihood adjustment module 24 may then determine a second magnitude of the LLR for a second error prone bit. The second error prone bit may be one of the bits for which a log-likelihood ratio is determined that has a log-likelihood ratio with the second smallest magnitude. In other words, whether the second error prone bit has a positive LLR or a negative LLR, the second error prone bit is the bit for which the certainty of the value of the bit is the second lowest.

Log-likelihood adjustment module 24 may determine an updated LLR for each bit for which a LLR was determined based on the first magnitude and the second magnitude. For this, log-likelihood adjustment module 24 may determine extrinsic information for the first error prone bit by determining whether the LLR for the first error prone bit is positive or negative, i.e., whether the first error prone bit is indicative of a 1 value or a 0 value for the bit. Log-likelihood adjustment module 24 may determine a first product. If it is determined that the LLR for the first error prone bit was positive, the first product will be equal to the second magnitude of the second error prone bit. If it is determined that the LLR for the first error prone bit was negative, the first product will be equal to the second magnitude of the second error prone bit multiplied by negative one. Log-likelihood adjustment module 24 may further determine the extrinsic information for the first error prone bit. The extrinsic information may be equal to the first product if the track parity check is satisfied. If the track parity check is not satisfied, the extrinsic information may be equal to the first product multiplied by negative one.

Log-likelihood adjustment module 24 may further determine respective extrinsic information for the remainder of the bits for which a LLR was determined, i.e. bits from the bit group that belong to a data sector that was identified as one or more possible sources of the at least one error. To do this, log-likelihood adjustment module 24 may determine whether the log-likelihood ratio for the respective bit is positive or negative. Log-likelihood adjustment module 24 may further determine a second product. If it is determined that the LLR for the respective bit was positive, the second product will be equal to the first magnitude of the first error prone bit. If it is determined that the LLR for the respective bit was negative, the second product will be equal to the first magnitude of the first error prone bit multiplied by negative one. Log-likelihood adjustment module 24 may further determine the respective extrinsic information for the respective bit. The respective extrinsic information may be equal to the second product if the track parity check is satisfied. If the track parity check is not satisfied, the extrinsic information may be equal to the second product multiplied by negative one. Once the respective extrinsic information for each bit is determined, log-likelihood adjustment module 24 may determine the updated log-likelihood ratio for each bit by adding the respective extrinsic information for the respective bit to the log-likelihood ratio for the respective bit.

In other words, the predicted value for each of the bits belonging to each data sector identified as one or more of the possible sources of the at least one error will remain the same after the LLR adjustment process, except for the first error prone bit, as the remainder of the bits have a larger magnitude for the bit's respective LLR than the first error prone bit. However, since there may be an error in these bits, the likelihood of the bit actually having the same value as indicated by the LLR will decrease. Further, techniques of this disclosure will change the first error prone bit's value using the LLR for the bit (e.g., changing the first error prone bit from a 0 to a 1 or from a 1 to a 0). This alteration of the bit value may change the previously run track parity check such that no error is present.

The techniques described above may be coupled with other error correction techniques. For instance, in some examples, error check module 22 may further perform a sector parity check for each data sector in the plurality of data sectors using the plurality of bits in each respective data sector. In other words, in addition to performing error checks using a bit from each data sector, each data sector may perform its own set of error checks. In some examples, each data sector may comprise a plurality of data bits and one or more parity bits. In each data sector, error check module 22 may use various combinations of the plurality of bits and one of the one or more parity bits to perform a sector parity check within each sector, further correcting the data in each sector. In some examples, in performing the sector parity check, error check module 22 may perform at least one sector parity check equation comprising an exclusive disjunction operation, such as an XOR operation, on a subset of the plurality of bits to obtain at least one result bit, the subset of the plurality of bits being some portion of the plurality of bits. Error check module 22 may compare this at least one result bit to a respective one of the one or more parity bits, determining that an error is present if the result bit is different from the respective parity bit.

In some examples, a very high precision of error checking may be required. In such examples, error check module 22 may perform the sector parity check on each data sector individually before performing the track parity check, and error check module 22 may further perform a second sector parity check on each data sector using the plurality of bits in each respective data sector. In some examples, after the second sector parity check, error check module 22 may further alternate between performing the track parity check and performing a sector parity check using the plurality of bits in each respective data sector until there are no errors in the data from the track. Each iteration of the error checks may lead the data from the track closer and closer to being an error-free track. By alternating between these two forms of parity checks, read channel 8 may be able to correct multiple data sectors while only adding a single parity sector to existing data tracks.

Figure 3:
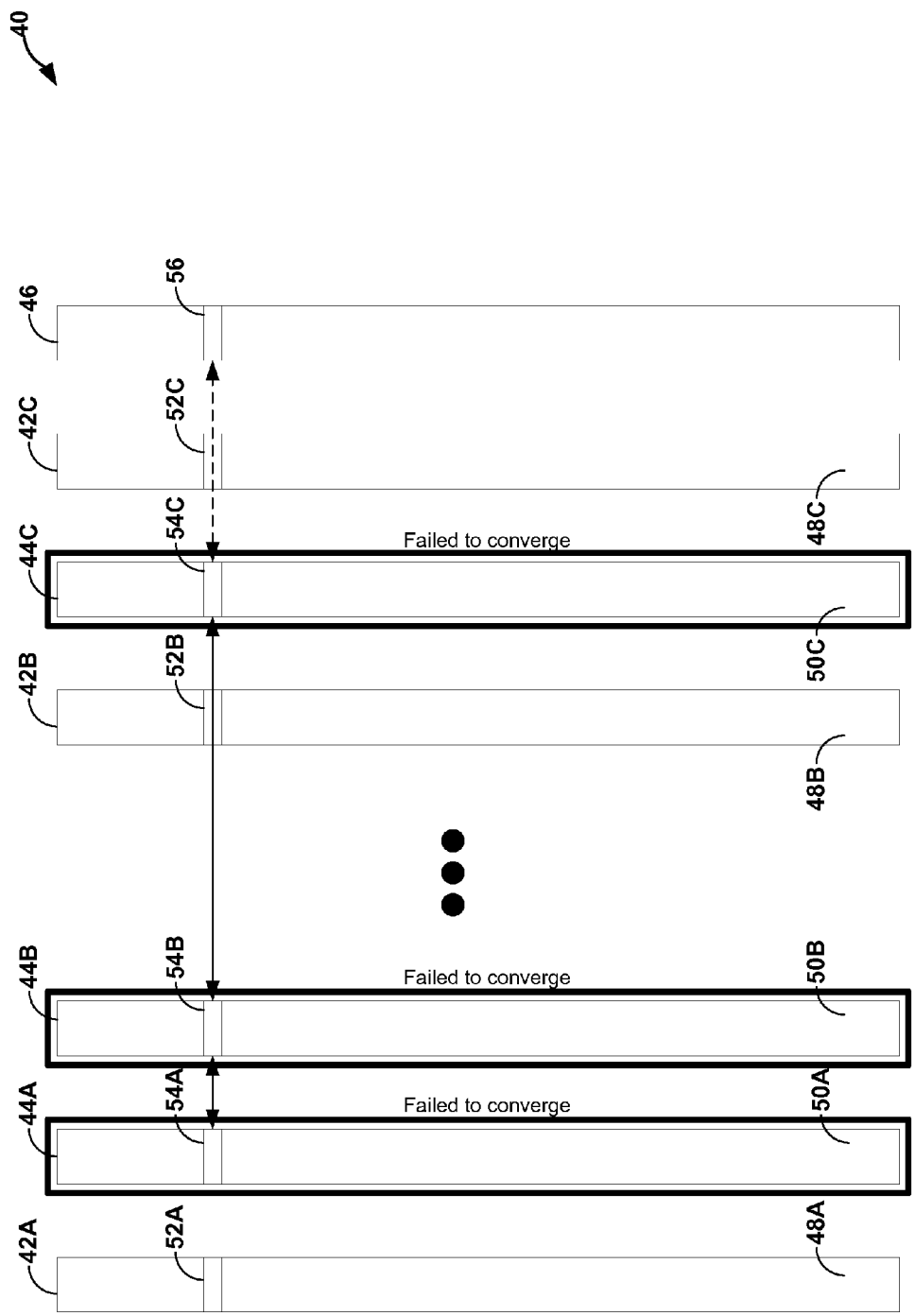
FIG. 3 is a conceptual diagram illustrating an example plurality of data sectors, some of which have failed to converge, and a parity sector, in accordance with one or more techniques of this disclosure.

FIG. 3 is a conceptual diagram illustrating an example track 40 comprising a plurality of data sectors, some of which have failed to converge, and a parity sector, in accordance with one or more techniques of this disclosure. The example of FIG. 3 shows one possible outcome of an error check that is performed where a read channel, such as read channel 8, determines whether the data from the track includes at least one error based at least in part on a bit group from the plurality of bit groups and a corresponding parity bit from the plurality of parity bits. In this example, bits 52A-52C and 54A-54C are chosen from the respective data sectors 42A-42C and 44A-44C. Further, parity bit 56 has been chosen from parity sector 46.

Read channel 8 determines a bit group, which is made up of bits 52A-52C and 54A-54C from the respective data sectors 42A-42C and 44A-44C, which corresponds to parity bit 56 from parity sector 46. Read channel 8 may determine whether the data from the track includes at least one error by performing a track parity check based on the bits in the bit group (i.e., bits 52A-52C and 54A-54C) and the corresponding parity bit (i.e., parity bit 56) from parity sector 46. In the example of FIG. 3, read channel 8 may determine that the data includes an error. In some examples, read channel 8 may perform an exclusive disjunction operation, such as an XOR operation, on bits 52A-52C and 54A-54C to obtain a result bit, and compare the result bit to the corresponding parity bit 56, determining that the data includes an error if the result bit is different than corresponding parity bit 56.

Responsive to determining that the data includes at least one error, read channel 8 may identify which data sectors out of data sectors 42A-42C and 44A-44C may be the one or more possible sources of the at least one error. In some examples, to identify one or more data sectors from the plurality of data sectors as one or more possible sources of the at least one error, read channel 8 may attempt to read each of the data sectors. Read channel 8 may flag a data sector as a possible source of the at least one error if the data sector fails to converge when being read by read channel 8. For example, as shown in FIG. 3, data sectors 44A-44C may fail to converge, while data sectors 42A-42C may converge. In this example, read channel 8 may identify data sectors data sectors 44A-44C, as well as any other sectors in track 40 that fail to converge, as one or more possible sources of the at least one error. Using techniques discussed in more detail with respect to FIGS. 4A-4B, read channel 8 may adjust a LLR for bits 54A-54C. In some examples, each of data sectors 42A-42C and 44A-44C further has a plurality of parity bits 48A-48C and 50A-50C that a read channel may be use for various sector parity checks within each of the respective data sectors, in accordance with the techniques discussed with respect to FIG. 2.

In some examples, read channel 8 may use other error-correcting code techniques coupled with the track parity check. For instance, in some examples, error check module 22 may further perform a sector parity check for each data sector in the plurality of data sectors using the plurality of bits in each respective data sector. In other words, in addition to performing a track parity check, each data sector may perform its own set of sector parity checks. In some examples, each data sector may comprise a plurality of data bits and one or more parity bits. In some cases, the parity bits may be least density parity check bits, and may be as much as 10-15% of the total number of bits in the sector. In each data sector, error check module 22 may use various combinations of the plurality of bits and one of the one or more parity bits to perform a sector parity check within each sector, further correcting the data in each sector. In some examples, in performing the sector parity check, error check module 22 may perform at least one sector parity check equation comprising an XOR operation on a subset of the plurality of bits to obtain at least one result bit, the subset of the plurality of bits being some portion of the plurality of bits. Error check module 22 may compare this at least one result bit to a respective one of the one or more parity bits, determining that an error is present if the result bit is different from the respective parity bit. Further, extrinsic information from the track parity check process may be passed into the sector decoding process, such as which sectors may have updated bits for the purposes of not performing extraneous sector parity checks when unnecessary.

While techniques described herein indicate that multiple failed data sectors may be recovered using a single parity sector, other examples of techniques described herein may utilize multiple parity sectors to increase the correction capability. For example, a first set of bit groups may comprise a bit from each of the data sectors, each bit being in the same position within the data sectors (i.e., the bit from the Nth position of each data sector). Further, a second set of bit groups may comprise a bit from each of the data sectors, each bit being in a different position within the data sectors (i.e., the Nth position of the first data sector, the Nth+1 position of the second data sector, etc.). When multiple parity sectors are used, some parity sectors may also include bits from other parity sectors in the bit group. This may provide further capabilities to correct even more failed sectors while having limited overhead. Further, in other examples of the techniques described herein, some data sectors may have multiple bits in a bit group. In other words, while described generally as having a bit from each data sector, a bit group can be any combination of bits in any combination of the plurality of data sectors.

FIGS. 4A and 4B are conceptual diagrams illustrating an example technique of adjusting log-likelihood ratios (LLRs) for data sectors that may contain an error, in accordance with one or more techniques of this disclosure. In FIG. 4A, a read channel, such as read channel 8 of FIG. 1, determines a LLR for at least each of 12 bits, wherein the 12 bits are part of the bit group and are located in data sectors that have been identified as one or more possible sources of the at least one error.

The LLR is a number that may be a positive number or a negative number. If the LLR is a positive number, then the LLR indicates that the value of the bit is more likely to be a 1 than a 0. If the LLR is a negative number, then the LLR indicates that the value of the bit is more likely to be a 0 than a 1. Further, the magnitude of the LLR indicates a certainty that the bit has a value of 0 or 1. For instance, if the LLR has a larger magnitude, then the LLR is more likely to be correct in indicating that the positive number is a 1 or the negative number is a 0. Conversely, if the LLR has a smaller magnitude, then the LLR is less likely to be correct in indicating that the positive number is a 1 or the negative number is a 0.

In the example of 4A, read channel 8 determines LLRs 62A, 64A, 66A, 68A, 70A, 72A, 74A, 76A, 78A, 80A, and 82A. Some LLRs, such as LLR 62A, LLR 72A, and LLR 78A, are positive LLRs with a relatively large magnitude. This means that there is a high likelihood that the bits associated with LLR 62A, LLR 72A, and LLR 78A have a value of 1. Further, some LLRs, such as LLR 64A and LLR 70A, are negative LLRs with a relatively large magnitude. This means that there is a high likelihood that the bits associated with LLR 64A and LLR 70A have a value of 0.

Other LLRs, such as LLR 66A, LLR 68A, LLR 74A, LLR 76A, LLR 80A, and LLR 82A, have relatively small magnitudes, meaning there is a lower likelihood that the value indicated by these LLRs is correct. In particular, LLR 68A has the smallest magnitude. As such, read channel 8 may determine that the bit associated with LLR 68A is a first error prone bit. LLR 74A has the second smallest magnitude, and read channel 8 may determine that the bit associated with LLR 74A is a second error prone bit.

Read channel 8 may use these various LLRs to adjust each LLR in an attempt to correct the at least one error. FIG. 4B shows the LLRs of FIG. 4A after read channel 8 has updated each of the LLRs. To update the LLRs, read channel 8 may determine that the LLR for the first error prone bit (i.e., the bit associated with LLR 68A) is positive. To get extrinsic information for the first error prone bit, the magnitude of the second error prone bit (i.e., LLR 74A) is multiplied by 1. Further, since the track parity check was not satisfied, read channel 8 multiplies LLR 74A by −1 to determine extrinsic information for the first error prone bit. As such, read channel 8 determines that the updated LLR 68B has a LLR equal to the LLR 68A plus the extrinsic information value.

Once updated LLR 68B for the first error prone bit is determined, read channel 8 may determine the remainder of the extrinsic information for the respective bits (i.e., updated LLRs 62B, 64B, 66B, 70B, 72B, 74B, 76B, 78B, 80B, and 82B) by determining whether the respective LLR is positive or negative. Reach channel 8 may determine a second product for the respective bit, wherein the second product is equal to the first magnitude of the first error prone bit (i.e., magnitude of LLR 68A) in response to determining the log-likelihood ratio for the respective bit is positive, and wherein the second product is equal to the first magnitude of the first error prone bit (i.e., magnitude of LLR 68A) multiplied by negative one in response to determining the log-likelihood ratio for the respective bit is negative. Read channel 8 may then determine the extrinsic information for the respective bit, wherein the extrinsic information is equal to the second product if the track parity check is satisfied, and wherein the extrinsic information is equal to the second product multiplied by negative one if the track parity check is not satisfied. Read channel 8 may determine the updated LLR for each bit by adding the respective extrinsic information for the respective bit to the log-likelihood ratio for the respective bit.

The predicted value for each of the bits belonging to each data sector identified as one or more of the possible sources of the at least one error will remain the same after the LLR adjustment process, except for the first error prone bit, as the remainder of the bits have a larger magnitude for the bit's respective LLR than the first error prone bit. However, since there may be an error in these bits, the likelihood of the bit actually having the same value as indicated by the LLR will decrease.

In other words, to determine the updated LLR for the respective bit, the following equations are used, wherein the syndrome is 0 if the track parity check is satisfied and is 1 if the track parity check is not satisfied:

Ex(least rel bit)=$\alpha$*|LLR(2nd least rel bit)|*sign
(LLR(least rel bit))*(syndrome*-2+1)

Ex(all other bits)=$\alpha$*|LLR(least rel bit)|*sign(LLR
(all other bit))*(syndrome*-2+1)

Min-Sum may over-estimate the extrinsic information (compared to Sum of Products algorithm). Thus, the extrinsic information may be scaled by a constant, such as $\sigma=\frac{3}{4}$, to make it closer to the correct value.

An iteration of such a technique may fix the errors found in the track of data. In such a case, read channel 8 may finish processing the track of data, such as by providing the track of data to a host, such as host 4 via controller 7 and interface 14. However, the bit that contains the error may not be fixed by a single iteration of the LLR-adjusting techniques described above. If an error still exists on the track of data, another iteration of these techniques may be performed on the track of data using the updated LLR values. In other words, once the LLR values for the bits from the bit group are adjusted, read channel 8 may determine if there is still an error present in the data from the track. If an error exists, read channel 8 may further adjust the updated LLR values by finding a new first error prone bit and a new second error prone bit and adjusting the updated LLRs based on the magnitudes of the new first error prone bit and the new second error prone bit.

Figure 5:
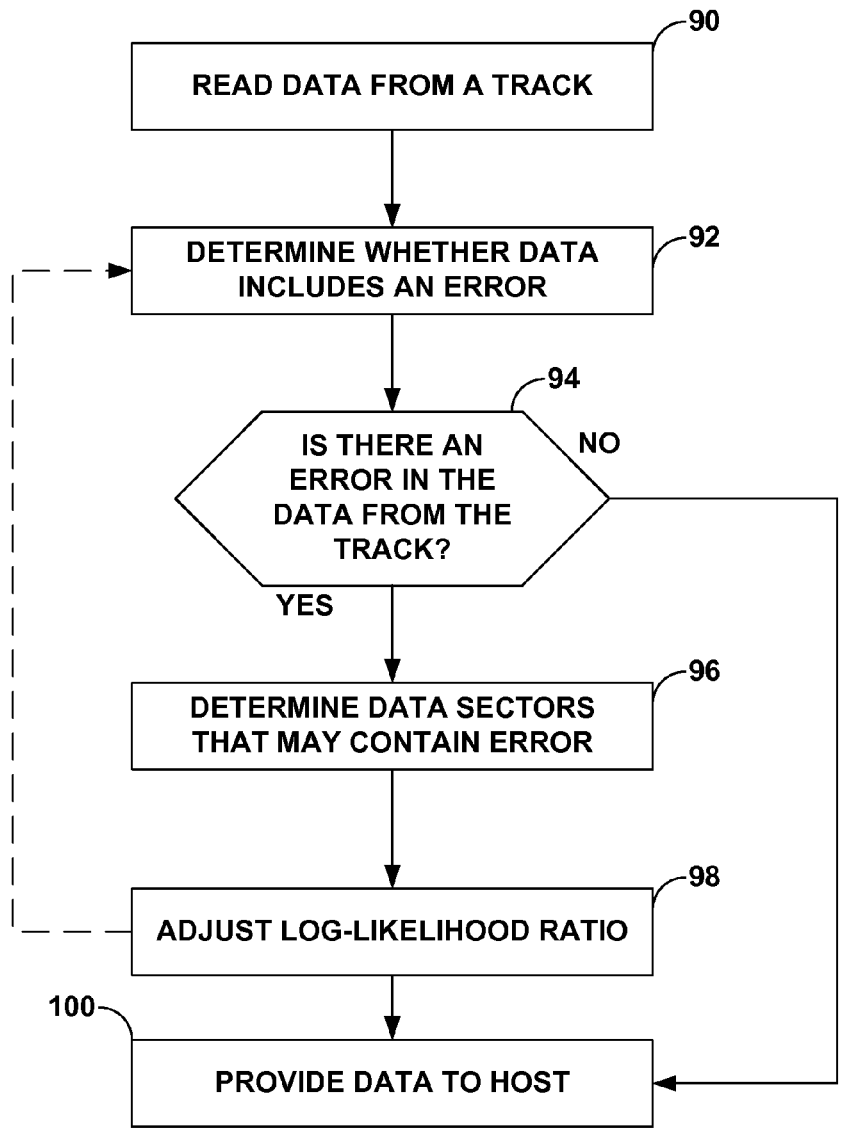
FIG. 5 is a flow diagram illustrating exemplary operation of a storage device read channel in performing various aspects of the track error-correcting code techniques described in this disclosure.

FIG. 5 is a flow diagram illustrating exemplary operation of a read channel in performing various aspects of the track error-correcting code techniques described in this disclosure. Various modules (e.g., data management module 20, error check module 22, and log-likelihood adjustment module 24 as shown in FIG. 2) of a read channel (e.g., read channel 8) on a hard drive (e.g., hard drive 6) may perform various techniques described in this disclosure. For example, data management module 20 may read data from a track (90). In some examples, a host may insert a data disk containing a track of data which data management module 20 may read via interface 14 and controller 7. For instance, the host may be a laptop or a desktop computer, and a user may insert a disk into the host, such as a compact disk, a floppy disk, or a Universal Serial Bus (USB) drive. In another example, data management module 20 may read a track of data from data storage devices 12 stored in hard drive 6 via memory manager 32.

Error check module 22 may determine whether the data from the track includes at least one error by performing a track parity check (92). Error check module 22 may group the data read from the track into a plurality of bit groups, with each bit group including a single bit from each of the plurality of data sectors. In some examples, the bits in the bit group may all be from the same position within the respective data sector. For instance, error check module 22 may form a bit group using a bit in the nth position from each of the plurality of data sectors through the use of an index, in some examples. In other examples, the bits in the bit group may be in different positions within the respective data sector. Furthermore, each parity bit from the plurality of parity bits may correspond to a respective bit group having a single bit from each of the plurality of data sectors. For each bit group and the corresponding parity bit, error check module 22 may run an error check on the respective bit group to determine if the data of the respective bit group includes at least one error. In some examples, the error check may be a track parity check, where error check module 22 performs an XOR operation on each bit in the bit group to obtain a result bit and compares the result bit to the parity bit that corresponds to the respective bit group. Error check module 22 may determine that an error is present if the result bit is different than the parity bit.

In some examples, error check module 22 may determine whether the data from the track includes at least one error by performing a track parity check using the technique described above for each of a plurality of bit groups, such that each bit in the track is used in at least one error check. In such a case, each bit group that includes at least one error may be corrected in accordance with one or more techniques of this disclosure. For instance, if the track has a total of 40,000 bit groups, and 1,000 of those bit groups contains at least one error, then error check module 22 may identify one or more sectors from the plurality of data sectors as one or more possible sources of the at least one error for each of the 1,000 bit groups that contain at least one error. Further, log-likelihood adjustment module 24 may adjust a log-likelihood ratio for at least one bit from each bit group.

Responsive to determining that the data includes at least one error (YES branch of 94), error check module 22 may identify one or more data sectors from the plurality of data sectors as one or more possible sources of the at least one error (96). In some examples, to identify one or more data sectors from the plurality of data sectors as one or more possible sources of the at least one error, read channel 8 may attempt to read each of the data sectors. Read channel 8 may flag a data sector as a possible source of the at least one error if the data sector fails to converge when being read by read channel 8. If a data sector fails to converge, for instance, error check module 22 may identify that data sector as a possible source of the at least one error. If error check module 22 identifies that the data sector is a possible source of the at least one error, then further actions may be taken. If error check module 22 identifies that the data sector is not a possible source of the at least one error, data management module 20 will store the safe data sectors in cache 9 via memory manager 32.

In attempting to correct the error, log-likelihood adjustment module 24 may adjust a log-likelihood ratio (LLR) for at least one bit from the bit group (98). For instance, by adjusting the LLR, one or more of the bits may be read differently (e.g., as a 0 instead of a 1 or a 1 instead of a 0). As described above, a positive LLR indicates a likeliness that the bit is a 1, and a negative LLR indicates a likeliness that the bit is a 0. Adjusting the LLR may cause one or more bits to have an LLR that changes from positive to negative or from negative to positive, thereby altering the likelihood of the value of the bit. By adjusting the LLR for at least one bit from the bit group used to determine if the data on the track includes an error, techniques of this disclosure may allow multiple data sectors to be corrected upon the determination of the presence of an error while only having the overhead of a single parity sector, thereby increasing correction efficiency and maximizing the available storage space on the said track.

Log-likelihood adjustment module 24 may adjust the LLR by first determining the LLR for each bit in the bit group that corresponds to the one or more data sectors from the plurality of data sectors identified as the one or more possible sources of the at least one error. As described above, a bit group comprises a bit from each data sector of the plurality of sectors. Using techniques described above to identify one or more data sectors that may be the one or more possible sources of the at least one error, log-likelihood adjustment module 24 may determine an LLR for each bit in the bit group corresponding to those sources. In some examples, the LLR may be determined by a read signal strength of that particular bit. The LLR is a number that may be a positive number or a negative number. If the LLR is a positive number, then the LLR indicates that the value of the bit is more likely to be a 1 than a 0. If the LLR is a negative number, then the LLR indicates that the value of the bit is more likely to be a 0 than a 1. Further, the magnitude of the LLR indicates a certainty that the bit has a value of 0 or 1. For instance, if the LLR has a larger magnitude, then the LLR is more likely to be correct in indicating that the positive number is a 1 or the negative number is a 0. Conversely, if the LLR has a smaller magnitude, then the LLR is less likely to be correct in indicating that the positive number is a 1 or the negative number is a 0.

For the set of bits for which a LLR was determined, log-likelihood adjustment module 24 may determine a first magnitude of the LLR for a first error prone bit. The first error prone bit may be one of the bits for which a log-likelihood ratio is determined that has a log-likelihood ratio with the smallest magnitude. In other words, whether the first error prone bit has a positive LLR or a negative LLR, the first error prone bit is the bit for which the certainty of the value of the bit is the least. Log-likelihood adjustment module 24 may then determine a second magnitude of the LLR for a second error prone bit. The second error prone bit may be one of the bits for which a log-likelihood ratio is determined that has a log-likelihood ratio with the second smallest magnitude. In other words, whether the second error prone bit has a positive LLR or a negative LLR, the second error prone bit is the bit for which the certainty of the value of the bit is the second least.

Log-likelihood adjustment module 24 may determine an updated LLR for each bit for which a LLR was determined based on the first magnitude and the second magnitude. For this, log-likelihood adjustment module 24 may determine extrinsic information for the first error prone bit by determining whether the LLR for the first error prone bit is positive or negative, i.e., whether the first error prone bit is indicative of a 1 value or a 0 value for the bit. Log-likelihood adjustment module 24 may determine a first product. If it is determined that the LLR for the first error prone bit was positive, the first product will be equal to the second magnitude of the second error prone bit. If it is determined that the LLR for the first error prone bit was negative, the first product will be equal to the second magnitude of the second error prone bit multiplied by negative one. Log-likelihood adjustment module 24 may further determine the extrinsic information for the first error prone bit. The extrinsic information may be equal to the first product if the track parity check is satisfied. If the track parity check is not satisfied, the extrinsic information may be equal to the first product multiplied by negative one.

Log-likelihood adjustment module 24 may further determine respective extrinsic information for the remainder of the bits for which a LLR was determined, i.e. bits from the bit group that belong to a data sector that was identified as one or more possible sources of the at least one error. To do this, log-likelihood adjustment module 24 may determine whether the log-likelihood ratio for the respective bit is positive or negative. Log-likelihood adjustment module 24 may further determine a second product. If it is determined that the LLR for the respective bit was positive, the second product will be equal to the first magnitude of the first error prone bit. If it is determined that the LLR for the respective bit was negative, the second product will be equal to the first magnitude of the first error prone bit multiplied by negative one. Log-likelihood adjustment module 24 may further determine the respective extrinsic information for the respective bit. The respective extrinsic information may be equal to the second product if the track parity check is satisfied. If the track parity check is not satisfied, the extrinsic information may be equal to the second product multiplied by negative one. Once the respective extrinsic information for each bit is determined, log-likelihood adjustment module 24 may determine the updated log-likelihood ratio for each bit by adding the respective extrinsic information for the respective bit to the log-likelihood ratio for the respective bit.

In other words, the predicted value for each of the bits belonging to each data sector identified as one or more of the possible sources of the at least one error will remain the same after the LLR adjustment process, except for the first error prone bit, as the remainder of the bits have a larger magnitude for the bit's respective LLR than the first error prone bit. However, since there may be an error in these bits, the likelihood of the bit actually having the same value as indicated by the LLR will decrease. Further, techniques of this disclosure will change the first error prone bit's value using the LLR for the bit (e.g., changing the first error prone bit from a 0 to a 1 or from a 1 to a 0). This alteration of the bit value may change the previously run track parity check such that no error is present.

In order to provide the most error-correction capabilities to a track of data, the techniques described above may be coupled with other error correction techniques. For instance, in some examples, error check module 22 may further perform a sector parity check for each data sector in the plurality of data sectors using the plurality of bits in each respective data sector. In other words, in addition to performing error checks using a bit from each data sector, each data sector may perform its own set of error checks. In some examples, each data sector may comprise a plurality of data bits and one or more parity bits. In each data sector, error check module 22 may use various combinations of the plurality of bits and one of the one or more parity bits to perform a sector parity check within each sector, further correcting the data in each sector. In some examples, in performing the sector parity check, error check module 22 may perform at least one sector parity check equation comprising an XOR operation on a subset of the plurality of bits to obtain at least one result bit, the subset of the plurality of bits being some portion of the plurality of bits. Error check module 22 may compare this at least one result bit to a respective one of the one or more parity bits, determining that an error is present if the result bit is different from the respective parity bit.

In some examples, a very high precision of error checking may be required. In such examples, error check module 22 may perform the sector parity check on each data sector individually before performing the track parity check, and error check module 22 may further perform a second sector parity check on each data sector using the plurality of bits in each respective data sector. In some examples, after the second sector parity check, error check module 22 may further alternate between performing a track parity check and performing a sector parity check using the plurality of bits in each respective data sector until there are no errors in the data from the track (dotted line path of 98). Each iteration of the parity checks may lead the data from the track closer and closer to being an error-free track. By alternating between these two forms of error checking, read channel 8 may be able to correct multiple data sectors while only adding a single parity sector to existing data tracks. When the track of data is free from errors (NO branch of 94), read channel 8 may finish processing the data, such as by providing the track of data to host 4 (100).

The techniques described in this disclosure may be implemented, at least in part, in hardware, software, firmware, or any combination thereof. For example, various aspects of the described techniques may be implemented within one or more processing units, including one or more microprocessing units, digital signal processing units (DSPs), application specific integrated circuits (ASICs), field programmable gate arrays (FPGAs), or any other equivalent integrated or discrete logic circuitry, as well as any combinations of such components. The term "processing unit" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processing units, or other processing units, to implement one or more of the techniques described herein, such as when instructions included or encoded in the computer-readable storage medium are executed by the one or more processing units. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples of the disclosure have been described. Any combination of the described operations or functions is contemplated. These and other examples are within the scope of the following claims.

The invention claimed is:

1. A method comprising:
   reading, by a read channel of a hard drive, data from a track, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein each parity bit indicates a binary characteristic of the respective bit group with which the parity bit is associated;
   determining, by the read channel and based at least in part on a bit group from the plurality of bit groups and a corresponding parity bit from the plurality of parity bits, whether the data from the track includes at least one error by performing a track parity check; and,
   responsive to determining that the data includes at least one error:
      identifying, by the read channel, one or more data sectors from the plurality of data sectors as one or more possible sources of the at least one error; and
      adjusting, by the read channel, a log-likelihood ratio for at least one bit from the bit group.

2. The method of claim 1, wherein adjusting the log-likelihood ratio comprises:
   determining, by the read channel, the log-likelihood ratio for each bit in the bit group that corresponds to the one or more data sectors from the plurality of data sectors identified as the one or more possible sources of the at least one error;
   determining, by the read channel, a first magnitude of the log-likelihood ratio for a first error prone bit, wherein the first error prone bit is one of the bits for which a log-likelihood ratio is determined that has a log-likelihood ratio with the smallest magnitude;
   determining, by the read channel, a second magnitude of the log-likelihood ratio for a second error prone bit, wherein the second error prone bit is one of the bits for which a log-likelihood ratio is determined that has a log-likelihood ratio with the second smallest magnitude; and
   determining, by the read channel, an updated log-likelihood ratio for each bit for which a log-likelihood ratio is determined based on the first magnitude and the second magnitude.

3. The method of claim 2, wherein determining the updated log-likelihood ratio comprises:
   determining, by the read channel, extrinsic information for the first error prone bit by at least:
   determining whether the log-likelihood ratio for the first error prone bit is positive or negative;
   determining a first product, wherein the first product is equal to the second magnitude in response to determining the log-likelihood ratio for the first error prone bit is positive, and wherein the first product is equal to the second magnitude multiplied by negative one in response to determining the log-likelihood ratio for the first error prone bit is negative; and
   determining the extrinsic information for the first error prone bit, wherein the extrinsic information is equal to the first product if the track parity check is satisfied, and wherein the extrinsic information is equal to the first product multiplied by negative one if the track parity check is not satisfied;
   determining, by the read channel, respective extrinsic information for a remainder of the bits for which a log-likelihood ratio is determined by at least:
      determining whether the log-likelihood ratio for the respective bit is positive or negative;
      determining a second product, wherein the second product is equal to the first magnitude in response to determining the log-likelihood ratio for the respective bit is positive, and wherein the second product is equal to the first magnitude multiplied by negative one in response to determining the log-likelihood ratio for the respective bit is negative; and determining the extrinsic information for the respective bit, wherein the extrinsic information is equal to the second product if the track parity check is satisfied, and wherein the extrinsic information is equal to the second product multiplied by negative one if the track parity check is not satisfied; and determining the updated log-likelihood for each bit for which a log-likelihood ratio is determined by adding the respective extrinsic information for the respective bit to the log-likelihood ratio for the respective bit.

4. The method of claim 1, wherein performing a track parity check comprises:

performing, by the read channel, an XOR operation on each bit in the bit group to obtain a result bit; and comparing, by the read channel, the result bit to the parity bit that corresponds to the respective bit group.

5. The method of claim 4, wherein determining that an error is present in the data from the track comprises determining, by the read channel and based on the comparison of the result bit to the parity bit, that the result bit is different than the parity bit.

6. The method of claim 1, the method further comprising:

for each data sector in the plurality of data sectors, performing, by the read channel, at least one sector parity check using the plurality of bits in each respective data sector.

7. The method of claim 6, wherein the sector parity check is a first sector parity check performed before the track parity check, the method further comprising:

for each data sector in the plurality of data sectors, performing, by the read channel, a second sector parity check using the plurality of bits in each respective data sector after performing the track parity check.

8. The method of claim 7, further comprising:

responsive to performing the second sector parity check, alternating, by the read channel, performing a track parity check and performing a sector parity check using the plurality of bits in each respective data sector until there are no errors in the data from the track.

9. The method of claim 6, wherein the plurality of bits in each data sector of the plurality of data sectors comprise a plurality of data bits and one or more parity bits.

10. The method of claim 9, wherein performing the sector parity check comprises:

performing, by the read channel, at least one sector parity check equation comprising an XOR operation on a subset of the plurality of data bits to obtain at least one result bit; and comparing, by the read channel, the at least one result bit to a respective one of the one or more parity bits.

11. The method of claim 1, wherein the track parity check is a first track parity check, the method further comprising:

determining, by the read channel and based at least in part on the bit group from the plurality of bit groups and the corresponding parity bit from the plurality of parity bits, that the data does not contain any errors by at least performing a second track parity check, wherein performing the second track parity check comprises:

performing, by the read channel, an XOR operation on each bit in the bit group to obtain a result bit; and comparing, by the read channel, the result bit to the parity bit that corresponds to the respective bit group, and wherein determining that the data does not contain any errors comprises determining, by the read channel and based on the comparison of a result bit to the parity bit, that the result bit is the same as the parity bit.

12. The method of claim 1, further comprising:

determining, by the read channel, an index value, wherein the index value indicates a bit group of the plurality of bit groups that the read channel will reference to determine whether the data from the track includes at least one error, wherein determining whether the data includes at least one error comprises determining, by the read channel, whether the data includes at least one error based on the bit group of the plurality of bit groups indicated by the index value.

13. The method of claim 1, wherein the log-likelihood ratio is either a positive number or a negative number, wherein a positive number indicates the value of the bit is more likely to be a 1 than a 0, wherein a negative number indicates the value of the bit is more likely to be a 0 than a 1, and wherein a larger magnitude of the positive number or the negative number indicates a higher likelihood that the log-likelihood ratio is correct in indicating that the positive number is a 1 or the negative number is a 0.

14. The method of claim 1, further comprising:

determining, by the read channel, the log-likelihood ratio for at least one bit from the bit group based at least in part on a read signal strength.

15. The method of claim 1, wherein identifying one or more data sectors from the plurality of data sectors as one or more possible sources of the at least one error comprises:

attempting, by the read channel, to read each data sector of the plurality of data sectors; and flagging, by the read channel, a data sector of the plurality of data sectors as one or more possible sources of the at least one error in response to the data sector failing to converge when the read channel attempts to read the data sector.

16. A device comprising:

a storage device configured to store a track of data, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein each parity bit indicates a binary characteristic of the respective bit group with which the parity bit is associated; and a read channel configured to:

read the data from the track;

determine, based at least in part on a bit group from the plurality of bit groups and a corresponding parity bit from the plurality of parity bits, whether the data from the track includes at least one error by performing a track parity check; and, responsive to determining that the data includes at least one error:

identify one or more data sectors from the plurality of data sectors as one or more possible sources of the at least one error; and adjust a log-likelihood ratio for at least one bit from the bit group.

17. The device of claim 16, wherein the read channel being configured to adjust the log-likelihood ratio comprises the read channel being configured to:
    determine the log-likelihood ratio for each bit in the bit group that corresponds to the one or more data sectors from the plurality of data sectors identified as the one or more possible sources of the at least one error;
    determine a first magnitude of the log-likelihood ratio for a first error prone bit, wherein the first error prone bit is one of the bits for which a log-likelihood ratio is determined that has a log-likelihood ratio with the smallest magnitude;
    determine a second magnitude of the log-likelihood ratio for a second error prone bit, wherein the second error prone bit is one of the bits for which a log-likelihood ratio is determined that has a log-likelihood ratio with the second smallest magnitude; and
    determine an updated log-likelihood ratio for each bit for which a log-likelihood ratio is determined based on the first magnitude and the second magnitude.

18. The device of claim 17, wherein the read channel being configured to determine the updated log-likelihood ratio comprises the read channel being configured to:
    determine extrinsic information for the first error prone bit by at least:
        determining whether the log-likelihood ratio for the first error prone bit is positive or negative;
        determining a first product, wherein the first product is equal to the second magnitude in response to determining the log-likelihood ratio for the first error prone bit is positive, and wherein the first product is equal to the second magnitude multiplied by negative one in response to determining the log-likelihood ratio for the first error prone bit is negative; and
        determining the extrinsic information for the first error prone bit, wherein the extrinsic information is equal to the first product if the track parity check is satisfied, and wherein the extrinsic information is equal to the first product multiplied by negative one if the track parity check is not satisfied;
    determine respective extrinsic information for a remainder of the bits for which a log-likelihood ratio is determined by at least:
        determining whether the log-likelihood ratio for the respective bit is positive or negative;
        determining a second product, wherein the second product is equal to the first magnitude in response to determining the log-likelihood ratio for the respective bit is positive, and wherein the second product is equal to the first magnitude multiplied by negative one in response to determining the log-likelihood ratio for the respective bit is negative; and
        determining the extrinsic information for the respective bit, wherein the extrinsic information is equal to the second product if the track parity check is satisfied, and wherein the extrinsic information is equal to the second product multiplied by negative one if the track parity check is not satisfied; and
    determine the updated log-likelihood for each bit for which a log-likelihood ratio is determined by adding the respective extrinsic information for the respective bit to the log-likelihood ratio for the respective bit.

19. The device of claim 16, wherein the read channel being configured to perform a track parity check comprises the read channel being configured to:
    perform an XOR operation on each bit in the bit group to obtain a result bit; and
    compare the result bit to the parity bit that corresponds to the respective bit group.

20. The device of claim 19, wherein the read channel being configured to determining that an error is present in the data from the track comprises the read channel being configured to determine, based on the comparison of the result bit to the parity bit, that the result bit is different than the parity bit.

21. The device of claim 16, wherein the read channel is further configured to:
    for each data sector in the plurality of data sectors, perform at least one sector parity check using the plurality of bits in each respective data sector.

22. The device of claim 21, wherein the sector parity check is a first sector parity check performed before the track parity check, and wherein the read channel is further configured to:
    for each data sector in the plurality of data sectors, perform a second sector parity check using the plurality of bits in each respective data sector after performing the track parity check.

23. The device of claim 22, wherein the read channel is further configured to:
    in response to performing the second parity error check, alternate performing a track parity check and performing a sector parity check using the plurality of bits in each respective data sector until there are no errors in the data from the track.

24. The device of claim 21, wherein the plurality of bits in each data sector of the plurality of data sectors comprise a plurality of data bits and one or more parity bits.

25. The device of claim 24, wherein the read channel being configured to perform the sector parity check comprises the read channel being configured to:
    perform at least one parity check equation comprising an XOR operation on a subset of the plurality of data bits to obtain at least one result bit; and
    compare the at least one result bit to a respective one of the one or more parity bits.

26. The device of claim 16, wherein the track parity check is a first track parity check, wherein the read channel is further configured to:
    determine, based at least in part on the bit group from the plurality of bit groups and the corresponding parity bit from the plurality of parity bits, that the data does not contain any errors by performing a second track parity check,
    wherein performing the second track parity check comprises the read channel being configured to:
        perform an XOR operation on each bit in the bit group to obtain a result bit; and
        compare the result bit to the parity bit that corresponds to the respective bit group, and
    wherein determining that the data does not contain any errors comprises the read channel being configured to determine, based on the comparison of a result bit to the parity bit, that the result bit is the same as the parity bit.

27. The device of claim 16, wherein the read channel is further configured to:
    determine an index value, wherein the index value indicates a bit group of the plurality of bit groups that the read channel will reference to determine whether the data from the track includes at least one error,
    wherein the read channel being configured to determine whether the data includes at least one error comprises the read channel being configured to determine whether the data includes at least one error based on the bit group of the plurality of bit groups indicated by the index value.

28. The device of claim 16, wherein the log-likelihood ratio is either a positive number or a negative number, wherein a positive number indicates the value of the bit is more likely to be a 1 than a 0, wherein a negative number indicates the value of the bit is more likely to be a 0 than a 1, and wherein a larger magnitude of the positive number or the negative number indicates a higher likelihood that the log-likelihood ratio is correct in indicating that the positive number is a 1 or the negative number is a 0.

29. The device of claim 16, wherein the read channel is further configured to:
   determine the log-likelihood ratio for at least one bit from the bit group based at least in part on a read signal strength.

30. The device of claim 16, wherein the read channel being configured to identify one or more data sectors from the plurality of data sectors as one or more possible sources of the at least one error comprises the read channel being configured to:
   attempt to read each data sector of the plurality of data sectors; and
   flag a data sector of the plurality of data sectors as one or more possible sources of the at least one error in response to the data sector failing to converge when the read channel attempts to read the data sector.

31. A device comprising:
   means for reading data from a track, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein each parity bit indicates a binary characteristic of the respective bit group with which the parity bit is associated;
   means for determining, based at least in part on a bit group from the plurality of bit groups and a corresponding parity bit from the plurality of parity bits, whether the data from the track includes at least one error by performing a track parity check; and,
   responsive to determining that the data includes at least one error:
      means for identifying one or more data sectors from the plurality of data sectors as one or more possible sources of the at least one error; and
      means for adjusting a log-likelihood ratio for at least one bit from the bit group.

32. A method comprising:
   reading, by a read channel, data from a track, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein each parity bit indicates a binary characteristic of the respective bit group with which the parity bit is associated;
   determining, by the read channel and based at least in part on a bit group from the plurality of bit groups and a corresponding parity bit from the plurality of parity bits, whether the data from the track includes at least one error by performing a track parity check; and,
   responsive to determining that the data includes at least one error:
      identifying, by the read channel, one or more data sectors from the plurality of data sectors as one or more possible sources of the at least one error; and
      adjusting, by the read channel, a log-likelihood ratio for at least one bit from the bit group.

33. The method of claim 32, wherein adjusting the log-likelihood ratio comprises:
   determining, by the read channel, the log-likelihood ratio for each bit in the bit group that corresponds to the one or more data sectors from the plurality of data sectors identified as the one or more possible sources of the at least one error;
   determining, by the read channel, a first magnitude of the log-likelihood ratio for a first error prone bit, wherein the first error prone bit is one of the bits for which a log-likelihood ratio is determined that has a log-likelihood ratio with the smallest magnitude;
   determining, by the read channel, a second magnitude of the log-likelihood ratio for a second error prone bit, wherein the second error prone bit is one of the bits for which a log-likelihood ratio is determined that has a log-likelihood ratio with the second smallest magnitude; and
   determining, by the read channel, an updated log-likelihood ratio for each bit for which a log-likelihood ratio is determined based on the first magnitude and the second magnitude.

34. The method of claim 33, wherein determining the updated log-likelihood ratio comprises:
   determining, by the read channel, extrinsic information for the first error prone bit by at least:
      determining whether the log-likelihood ratio for the first error prone bit is positive or negative;
      determining a first product, wherein the first product is equal to the second magnitude in response to determining the log-likelihood ratio for the first error prone bit is positive, and wherein the first product is equal to the second magnitude multiplied by negative one in response to determining the log-likelihood ratio for the first error prone bit is negative; and
      determining the extrinsic information for the first error prone bit, wherein the extrinsic information is equal to the first product if the track parity check is satisfied, and wherein the extrinsic information is equal to the first product multiplied by negative one if the track parity check is not satisfied;
   determining, by the read channel, respective extrinsic information for a remainder of the bits for which a log-likelihood ratio is determined by at least:
      determining whether the log-likelihood ratio for the respective bit is positive or negative;
      determining a second product, wherein the second product is equal to the first magnitude in response to determining the log-likelihood ratio for the respective bit is positive, and wherein the second product is equal to the first magnitude multiplied by negative one in response to determining the log-likelihood ratio for the respective bit is negative; and determining the extrinsic information for the respective bit, wherein the extrinsic information is equal to the second product if the track parity check is satisfied, and wherein the extrinsic information is equal to the second product multiplied by negative one if the track parity check is not satisfied; and determining the updated log-likelihood for each bit for which a log-likelihood ratio is determined by adding the respective extrinsic information for the respective bit to the log-likelihood ratio for the respective bit.

35. The method of claim 32, wherein performing a track parity check comprises:

performing, by the read channel, an XOR operation on each bit in the bit group to obtain a result bit; and comparing, by the read channel, the result bit to the parity bit that corresponds to the respective bit group.

36. The method of claim 35, wherein determining that an error is present in the data from the track comprises determining, by the read channel and based on the comparison of the result bit to the parity bit, that the result bit is different than the parity bit.

37. The method of claim 32, the method further comprising:

for each data sector in the plurality of data sectors, performing, by the read channel, at least one sector parity check using the plurality of bits in each respective data sector.

38. The method of claim 37, wherein the sector parity check is a first sector parity check performed before the track parity check, the method further comprising:

for each data sector in the plurality of data sectors, performing, by the read channel, a second sector parity check using the plurality of bits in each respective data sector after performing the track parity check.

39. The method of claim 38, further comprising:

responsive to performing the second sector parity check, alternating, by the read channel, performing a track parity check and performing a sector parity check using the plurality of bits in each respective data sector until there are no errors in the data from the track.

40. The method of claim 37, wherein the plurality of bits in each data sector of the plurality of data sectors comprise a plurality of data bits and one or more parity bits.

41. The method of claim 40, wherein performing the sector parity check comprises:

performing, by the read channel, at least one sector parity check equation comprising an XOR operation on a subset of the plurality of data bits to obtain at least one result bit; and comparing, by the read channel, the at least one result bit to a respective one of the one or more parity bits.

42. The method of claim 32, wherein the track parity check is a first track parity check, the method further comprising:

determining, by the read channel and based at least in part on the bit group from the plurality of bit groups and the corresponding parity bit from the plurality of parity bits, that the data does not contain any errors by at least performing a second track parity check, wherein performing the second track parity check comprises:

performing, by the read channel, an XOR operation on each bit in the bit group to obtain a result bit; and comparing, by the read channel, the result bit to the parity bit that corresponds to the respective bit group, and wherein determining that the data does not contain any errors comprises determining, by the read channel and based on the comparison of a result bit to the parity bit, that the result bit is the same as the parity bit.

43. The method of claim 32, further comprising:

determining, by the read channel, an index value, wherein the index value indicates a bit group of the plurality of bit groups that the read channel will reference to determine whether the data from the track includes at least one error, wherein determining whether the data includes at least one error comprises determining, by the read channel, whether the data includes at least one error based on the bit group of the plurality of bit groups indicated by the index value.

44. The method of claim 32, wherein the log-likelihood ratio is either a positive number or a negative number, wherein a positive number indicates the value of the bit is more likely to be a 1 than a 0, wherein a negative number indicates the value of the bit is more likely to be a 0 than a 1, and wherein a larger magnitude of the positive number or the negative number indicates a higher likelihood that the log-likelihood ratio is correct in indicating that the positive number is a 1 or the negative number is a 0.

45. The method of claim 32, further comprising:

determining, by the read channel, the log-likelihood ratio for at least one bit from the bit group based at least in part on a read signal strength.

46. The method of claim 32, wherein identifying one or more data sectors from the plurality of data sectors as one or more possible sources of the at least one error comprises:

attempting, by the read channel, to read each data sector of the plurality of data sectors; and flagging, by the read channel, a data sector of the plurality of data sectors as one or more possible sources of the at least one error in response to the data sector failing to converge when the read channel attempts to read the data sector.

47. A read channel comprising: a serial communication link;

a front end configured to:

receive a signal comprising a track of data, wherein the track comprises a plurality of data sectors and a parity sector, wherein each data sector in the plurality of data sectors comprises a plurality of bits, wherein the parity sector comprises a plurality of parity bits, wherein the data includes a plurality of bit groups, each bit group including a single bit from each of the plurality of data sectors, wherein each parity bit from the plurality of parity bits corresponds to a respective bit group having a single bit from each of the plurality of data sectors, and wherein each parity bit indicates a binary characteristic of the respective bit group with which the parity bit is associated; and a decoder configured to:

read the data from the track;

determine, based at least in part on a bit group from the plurality of bit groups and a corresponding parity bit from the plurality of parity bits, whether the data from the track includes at least one error by performing a track parity check; and, responsive to determining that the data includes at least one error:

identify one or more data sectors from the plurality of data sectors as one or more possible sources of the at least one error; and
adjust a log-likelihood ratio for at least one bit from the bit group.

48. The read channel of claim 47, wherein the decoder being configured to adjust the log-likelihood ratio comprises the decoder being configured to:
determine the log-likelihood ratio for each bit in the bit group that corresponds to the one or more data sectors from the plurality of data sectors identified as the one or more possible sources of the at least one error;
determine a first magnitude of the log-likelihood ratio for a first error prone bit, wherein the first error prone bit is one of the bits for which a log-likelihood ratio is determined that has a log-likelihood ratio with the smallest magnitude;
determine a second magnitude of the log-likelihood ratio for a second error prone bit, wherein the second error prone bit is one of the bits for which a log-likelihood ratio is determined that has a log-likelihood ratio with the second smallest magnitude; and
determine an updated log-likelihood ratio for each bit for which a log-likelihood ratio is determined based on the first magnitude and the second magnitude.

49. The read channel of claim 48, wherein the decoder being configured to determine the updated log-likelihood ratio comprises the decoder being configured to:
determine extrinsic information for the first error prone bit by at least:
determining whether the log-likelihood ratio for the first error prone bit is positive or negative;
determining a first product, wherein the first product is equal to the second magnitude in response to determining the log-likelihood ratio for the first error prone bit is positive, and wherein the first product is equal to the second magnitude multiplied by negative one in response to determining the log-likelihood ratio for the first error prone bit is negative; and
determining the extrinsic information for the first error prone bit, wherein the extrinsic information is equal to the first product if the track parity check is satisfied, and wherein the extrinsic information is equal to the first product multiplied by negative one if the track parity check is not satisfied;
determine respective extrinsic information for a remainder of the bits for which a log-likelihood ratio is determined by at least:
determining whether the log-likelihood ratio for the respective bit is positive or negative;
determining a second product, wherein the second product is equal to the first magnitude in response to determining the log-likelihood ratio for the respective bit is positive, and wherein the second product is equal to the first magnitude multiplied by negative one in response to determining the log-likelihood ratio for the respective bit is negative; and
determining the extrinsic information for the respective bit, wherein the extrinsic information is equal to the second product if the track parity check is satisfied, and wherein the extrinsic information is equal to the second product multiplied by negative one if the track parity check is not satisfied; and
determine the updated log-likelihood for each bit for which a log-likelihood ratio is determined by adding the respective extrinsic information for the respective bit to the log-likelihood ratio for the respective bit.

50. The read channel of claim 47, wherein the decoder being configured to perform a track parity check comprises the decoder being configured to:
perform an XOR operation on each bit in the bit group to obtain a result bit; and compare the result bit to the parity bit that corresponds to the respective bit group.

51. The read channel of claim 50, wherein the decoder being configured to determining that an error is present in the data from the track comprises the decoder being configured to determine, based on the comparison of the result bit to the parity bit, that the result bit is different than the parity bit.

52. The read channel of claim 47, wherein the decoder is further configured to:
for each data sector in the plurality of data sectors, perform at least one sector parity check using the plurality of bits in each respective data sector.

53. The read channel of claim 52, wherein the sector parity check is a first sector parity check performed before the track parity check, and wherein the decoder is further configured to:
for each data sector in the plurality of data sectors, perform a second sector parity check using the plurality of bits in each respective data sector after performing the track parity check.

54. The read channel of claim 53, wherein the decoder is further configured to:
in response to performing the second parity error check, alternate performing a track parity check and performing a sector parity check using the plurality of bits in each respective data sector until there are no errors in the data from the track.

55. The read channel of claim 52, wherein the plurality of bits in each data sector of the plurality of data sectors comprise a plurality of data bits and one or more parity bits.

56. The read channel of claim 55, wherein the decoder being configured to perform the sector parity check comprises the decoder being configured to:
perform at least one parity check equation comprising an XOR operation on a subset of the plurality of data bits to obtain at least one result bit; and
compare the at least one result bit to a respective one of the one or more parity bits.

57. The read channel of claim 47, wherein the track parity check is a first track parity check, wherein the decoder is further configured to:
determine, based at least in part on the bit group from the plurality of bit groups and the corresponding parity bit from the plurality of parity bits, that the data does not contain any errors by performing a second track parity check,
wherein the decoder being configured to perform the second track parity check comprises the decoder being configured to:
perform an XOR operation on each bit in the bit group to obtain a result bit; and
compare the result bit to the parity bit that corresponds to the respective bit group, and
wherein the decoder being configured to determine that the data does not contain any errors comprises the decoder being configured to determine, based on the comparison of a result bit to the parity bit, that the result bit is the same as the parity bit.

58. The read channel of claim 47, wherein the decoder is further configured to:
determine an index value, wherein the index value indicates a bit group of the plurality of bit groups that the read channel will reference to determine whether the data from the track includes at least one error, wherein the decoder being configured to determine whether the data includes at least one error comprises the decoder being configured to determine whether the data includes at least one error based on the bit group of the plurality of bit groups indicated by the index value.

59. The read channel of claim 47, wherein the log-likelihood ratio is either a positive number or a negative number, wherein a positive number indicates the value of the bit is more likely to be a 1 than a 0, wherein a negative number indicates the value of the bit is more likely to be a 0 than a 1, and wherein a larger magnitude of the positive number or the negative number indicates a higher likelihood that the log-likelihood ratio is correct in indicating that the positive number is a 1 or the negative number is a 0.

60. The read channel of claim 47, wherein the decoder is further configured to:

determine the log-likelihood ratio for at least one bit from the bit group based at least in part on a read signal strength.

61. The read channel of claim 47, wherein the decoder being configured to identify one or more data sectors from the plurality of data sectors as one or more possible sources of the at least one error comprises the decoder being configured to:

attempt to read each data sector of the plurality of data sectors; and flag a data sector of the plurality of data sectors as one or more possible sources of the at least one error in response to the data sector failing to converge when the read channel attempts to read the data sector.

* * * * *